US011101389B2

(12) United States Patent
Ahirwar et al.

(10) Patent No.: US 11,101,389 B2
(45) Date of Patent: Aug. 24, 2021

(54) DUAL-USE SEMICONDUCTOR DEVICE FOR SOLAR POWER AND DATA STORAGE

(71) Applicant: Marvell Asia Pte, Ltd., Singapore (SG)

(72) Inventors: Vijay Ahirwar, Pune (IN); Sri Varsha Rottela, Visakhapatnam (IN); Nilesh N Khude, Pune (IN); B Hari Ram, Chennai (IN)

(73) Assignee: Marvell Asia PTE, Ltd., Singapore (SG)

(*) Notice: Subject to any disclaimer, the term of this patent is extended or adjusted under 35 U.S.C. 154(b) by 0 days.

(21) Appl. No.: 16/796,680

(22) Filed: Feb. 20, 2020

(65) Prior Publication Data

US 2020/0274005 A1 Aug. 27, 2020

Related U.S. Application Data

(60) Provisional application No. 62/808,703, filed on Feb. 21, 2019.

(51) Int. Cl.

| | |
|---|---|
| ***G11C 16/04*** | (2006.01) |
| ***H01L 31/02*** | (2006.01) |
| ***H01L 21/28*** | (2006.01) |
| ***G11C 11/56*** | (2006.01) |
| ***G11C 16/10*** | (2006.01) |

(Continued)

(52) U.S. Cl.

CPC .... *H01L 31/02021* (2013.01); *G11C 11/5628* (2013.01); *G11C 11/5635* (2013.01); *G11C 11/5642* (2013.01); *G11C 16/0408* (2013.01); *G11C 16/10* (2013.01); *G11C 16/14* (2013.01); *G11C 16/26* (2013.01); *H01L 27/11521* (2013.01); *H01L 29/40114* (2019.08);

(Continued)

(58) Field of Classification Search

CPC ......... H01L 31/02021; H01L 29/40114; G11C 11/5628; G11C 11/5635; G11C 11/5642; G11C 16/0408; G11C 16/10; G11C 16/14; G11C 16/26

USPC .................................................... 365/185.29

See application file for complete search history.

(56) References Cited

U.S. PATENT DOCUMENTS

| | | | |
|---|---|---|---|
| 4,641,167 | A | 2/1987 | Nishizawa |
| 2010/0108138 | A1 | 5/2010 | Smith et al. |

(Continued)

OTHER PUBLICATIONS

"Extended European Search Report", EP Application No. 20158731.8, dated Jun. 17, 2020, 7 pages.

*Primary Examiner* — Huan Hoang

(57) ABSTRACT

The present disclosure describes aspects of a dual-use semiconductor device for solar power and data storage. In some aspects, a dual-use semiconductor device is selectively configured to generate power by coupling regions having a same type of doping to form a PN junction by which power is generated in response to light. The generated power may be provided to a load coupled to contacts (e.g., front and backside contacts) of the dual-use semiconductor device. The dual-use semiconductor device is also selectively configurable for data storage by decoupling the regions of the same type of doping to provide respective data storage access terminals for accessing (e.g., writing or reading) a bit value that is stored as a level of charge by a floating-gate structure of the dual-use semiconductor device. By so doing, solar power arrays implemented with dual-use semiconductor devices may also provide data storage functionality.

20 Claims, 8 Drawing Sheets

(51) Int. Cl.

| | |
|---|---|
| ***G11C 16/14*** | (2006.01) |
| ***G11C 16/26*** | (2006.01) |
| ***H01L 27/11521*** | (2017.01) |
| ***H01L 29/66*** | (2006.01) |
| ***H01L 29/788*** | (2006.01) |
| ***H01L 31/068*** | (2012.01) |
| ***H01L 31/18*** | (2006.01) |

(52) U.S. Cl.

CPC .... *H01L 29/66825* (2013.01); *H01L 29/7883* (2013.01); *H01L 31/068* (2013.01); *H01L 31/18* (2013.01)

(56) References Cited

U.S. PATENT DOCUMENTS

2015/0108425 A1* 4/2015 Rosenman ............ H01L 27/307 257/13

2017/0084648 A1 3/2017 Liu et al.

* cited by examiner

DUAL-USE SEMICONDUCTOR DEVICE FOR SOLAR POWER AND DATA STORAGE

CROSS REFERENCE TO RELATED APPLICATIONS

This present disclosure claims priority to U.S. Provisional Patent Application Ser. No. 62/808,703 filed Feb. 21, 2019, the disclosure of which is incorporated by reference herein in its entirety.

BACKGROUND

In electronic circuit design, semiconductor components are often designed and manufactured to perform an intended electrical function. For example, solar cells are designed to generate electrical current when photons of incident sunlight interact with specifically formulated and structured materials of the solar cells. Many semiconductor components, however, are utilized to provide their intended function for only a fraction of the component's total lifespan. In the context of the present example, solar cells are idle every night after sunset and when weather prevents sufficient sunlight collection for energy generation. Thus, for all the resources consumed to produce and deploy solar cells, the solar cells generate power for only a limited time and remain unused for the remainder of time. With large numbers of solar cells and other types of single-purpose semiconductor components deployed across the globe, the combined idle time of those semiconductor components may represent a substantial underutilization of the underlying semiconductor materials.

SUMMARY

This summary is provided to introduce subject matter that is further described in the Detailed Description and Drawings. Accordingly, this Summary should not be considered to describe essential features nor used to limit the scope of the claimed subject matter.

This disclosure is directed to aspects of a dual-use semiconductor device for solar power and data storage. In some aspects, a dual-use semiconductor device is selectively configured to generate power by coupling regions having a same type of doping to from a PN junction by which power is generated in response to light. In some aspects, the dual-use semiconductor device functions as a photovoltaic cell or photo diode to generate power when configured with the PN junction. The generated power may be provided to a load coupled to contacts (e.g., front and backside contacts) of the dual-use semiconductor device.

The dual-use semiconductor device may also be selectively configurable for data storage by decoupling the regions of the same type of doping to provide respective data storage access terminals (e.g., source and drain) for accessing (e.g., writing or reading) a bit value that is stored as a level of charge by a floating-gate structure of the dual-use semiconductor device. Generally, the charge of a floating-gate of the floating-gate structure affects a threshold of the dual-use semiconductor device (e.g., configured as a floating-gate transistor), such that a negative charge of electrons on the floating gate prevents a control gate of the structure from activating the dual-use semiconductor device when a read voltage is applied and no current flows between through the dual-use semiconductor device (e.g., logic 0).

Alternatively or additionally, when a negative charge is not present on the floating gate (e.g., absence of electrons), the control gate is able to activate the dual-use semiconductor device when the read voltage is applied and current flows between through the dual-use semiconductor device (e.g., logic 1). As such, respective voltages may be selectively applied to the control gate and the data storage access terminals to write or erase the bit value to the floating-gate structure by altering a charge of a floating gate of the structure, such as by tunneling (or injecting) electrons into or from the floating gate.

In some aspects, a method implemented by a controller associated with a dual-use semiconductor device includes selectively configuring a dual-use semiconductor device to generate power by coupling regions of the dual-use semiconductor device having a same type of doping to form a PN junction. The PN junction is formed with the coupled regions and a substrate of the dual-use semiconductor device having a different type of doping. The method includes generating, with the PN junction, power based on light received by the PN junction that includes the coupled regions. In response to generating the power, the dual-use semiconductor device provides the power to a load coupled to respective power contacts of the dual-use semiconductor device. The method also includes selectively configuring the dual-use semiconductor device for data storage access by decoupling the regions of the dual-use semiconductor device having the same type of doping to provide respective data storage access terminals via the decoupled regions having the same type of doping. The controller then accesses, via a control gate of a floating-gate structure of the dual-use semiconductor device and at least one of the respective data storage access terminals, the dual-use semiconductor device to write data to or read data from the floating-gate structure. The floating-gate structure may be formed on the substrate of the dual-use semiconductor device and have a floating-gate that is isolated from the control gate of the floating-gate structure by a first layer of insulative material and isolated from the substrate by a second layer of insulative material.

In other aspects, a dual-use semiconductor device comprises a substrate that includes a first region and a second region having a same type of doping and a well having a different type of doping. A switch device of the dual-use semiconductor device is coupled between the first region and the second region and configured to selectively connect the first region to the second region to generate power and disconnect first region from the second region to enable storage of at least one bit value. The dual-use semiconductor device also includes a floating-gate structure disposed over at least a portion of the well that is configured to store a charge that corresponds to the at least one bit value. The floating-gate structure includes a first layer of insulative material disposed over the at least a portion of the well and is configured to permit tunneling electrons to enter or leave the floating-gate structure. A floating-gate of the structure is disposed over the first layer of insulative material and configured to store, while insulated from the well by the first layer of insulative material, the charge that corresponds to the at least one bit value based on the tunneling electrons that enter or leave the floating-gate structure. The structure includes a second layer of insulative material disposed over the floating-gate of the floating-gate structure. A control gate of the structure is disposed over the second layer of insulative material and configured to control the tunneling of the electrons to charge or discharge the floating-gate structure.

In yet other aspects, a solar power and data storage system comprises a plurality of dual-use semiconductor devices and a configuration controller. At least some of the dual-use semiconductor devices are implemented with a substrate that includes a first region and a second region having a same type of doping and a well having a different type of doping. The dual-use semiconductor devices may also include a switch device and a floating-gate structure disposed over the well. The switch is coupled between the first region and the second region and configured to selectively connect the first region to the second region to generate power and disconnect first region from the second region to enable storage of at least one bit value. The floating-gate structure has a floating gate configured to store a charge that corresponds to the at least one bit value while insulated from the well and a control gate of the floating-gate structure by respective layers of insulative material.

The configuration controller is implemented to selectively couple the regions having the same type of doping for form, with the coupled regions and the well, a PN junction by which the dual-use semiconductor device generates the power. The configuration controller is also implemented to selectively decouple the regions having the same type of doping to provide respective data storage access terminals via the decoupled regions having the same type of doping to enable writing or reading of the at least one bit of data.

The details of one or more implementations are set forth in the accompanying drawings and the following description. Other features and advantages will be apparent from the description, drawings, and the appended claims.

BRIEF DESCRIPTION OF THE DRAWINGS

The details of one or more implementations of a dual-use semiconductor device for solar power and data storage are set forth in the accompanying figures and the detailed description below. In the figures, the left-most digit of a reference number identifies the figure in which the reference number first appears. The use of the same reference numbers in different instances in the description and the figures indicates like elements.

DETAILED DESCRIPTION

Figure 1:
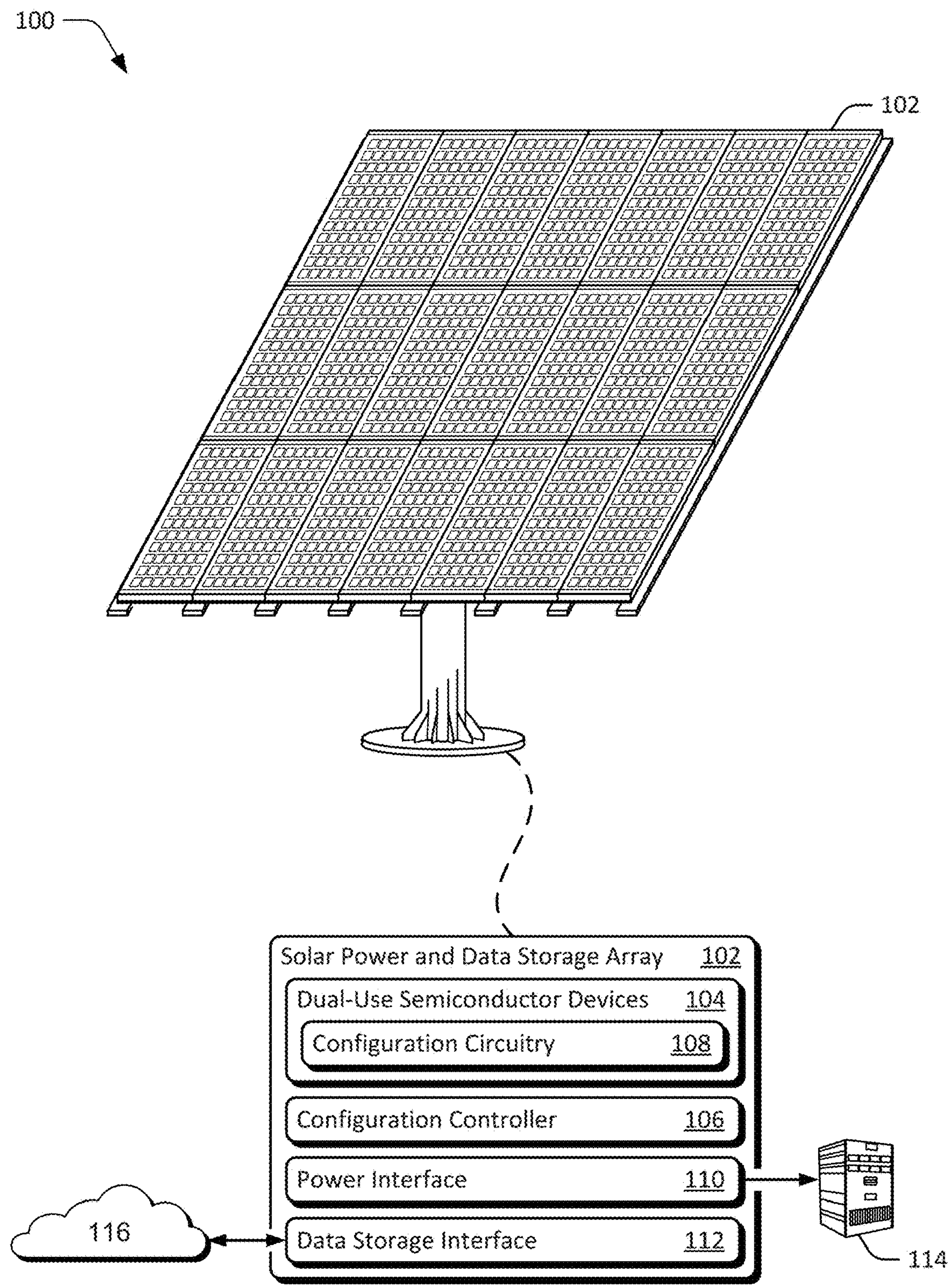
FIG. 1 illustrates an example operating environment in which dual-use semiconductor devices for solar power and data storage are implemented.

Conventional techniques for circuit design often create semiconductor components that are designed and manufactured to perform a single or dedicated electrical function. For example, solar cells are designed to generate electrical current when photons of incident sunlight interact with specifically formulated and structured materials of the solar cells. In other cases, memory cells are designed to receive and store data values until those data values are read from the memory cells later.

Many of these conventional semiconductor components, however, are utilized to provide their intended function for only a fraction of the component's overall lifespan. By way of example, solar cells are idle every night after sunset and when weather prevents sufficient sunlight collection for energy generation. Additionally, memory cells used for long-term data storage may be rarely accessed, such as when backup data is requested due to a primary data system failure. Thus, for all the resources consumed to produce and deploy these semiconductor components, actual use of the components may be limited with respect to a single purpose or amount of time. With large numbers of solar cells and other types of single-purpose semiconductor components deployed across the globe, the combined idle time of those components may represent a substantial underutilization of the underlying semiconductor materials.

In contrast with conventional semiconductor component design and deployment, this disclosure describes dual-use semiconductor devices for solar power and data storage. In various aspects, semiconductor materials are formed as dual-use devices for solar power (e.g., solar cells) and data storage (e.g., memory cells or bits). In other words, the described semiconductor devices may implement both solar power and data storage functionalities, thereby enabling solar power arrays both to generate electricity and store data. By so doing, the solar power arrays implemented with the dual-use semiconductor devices may also provide data storage functionality alternatively, allowing the solar cell arrays to also function as data storage centers or cloud-linked data storage.

Generally, the dual-use semiconductor devices may be configured as solar cells or solar photo diodes to generate electricity or as floating-gate transistors for storing information. In some cases, source and drain regions (or wells) of a dual-use semiconductor device are connected or shorted to form a photo diode with a PN junction or PIN diode that is optically exposed to receive light. In response to photons of the incident light, the dual-use semiconductor device generates an electric current that can be provided to a load or power storage system. In other cases, a first voltage is applied across the source and drain regions (in an unconnected state) and a second voltage is applied to a control gate of a floating-gate structure of the dual-use semiconductor device to read from or write data to the dual-use semiconductor device. As such, the dual-use semiconductor devices may be used to generate electricity and store data, resulting in an increased utilization of the underlying semiconductor materials of the dual-use semiconductor devices.

The implementation of dual-use semiconductor devices for solar power and data storage offer several advantages. Large numbers of solar devices are widely deployed for clean energy production, which may translate into a substantial installation base for implementing hybrid solar power and data storage arrays with these dual-use devices. In some cases, the dual-use semiconductor devices act as flash memory storage for storing data with low latency requirements, such as long-term back up data. Thus, solar power plants implemented with the described dual-use semiconductor devices may also serve as data centers. In other implementations of dual-use semiconductor devices, consumer-level home solar plants may provide cloud storage for back up purposes. During the day, the solar power functionality of the dual-use devices may provide power for an associated memory array of the dual-use devices, though the dual-use devices may require the use of stored or external power at night. Other advantages of dual-use semiconductor devices may include reduced real estate costs from the consolidation of solar power and data center facilities, which are typically real estate intensive when built out separately. Further, data centers implemented with the dual-use semiconductor devices may generate and consume inhouse power, which can result in lower overall demand on a local grid and reduce electricity costs associated with data storage.

In various aspects described herein, a dual-use semiconductor device may be implemented for solar power and data storage. In some aspects, the dual-use semiconductor device is configured to generate power based on light received through an exposed PN junction of the device and provide power to a load that is coupled to contacts of the dual-use semiconductor device. The dual-use semiconductor device is also configurable for data storage, which enables access to data of the dual-use semiconductor device through a gate contact to write data to or read data from a floating-gate structure of the dual-use semiconductor device. By so doing, solar power arrays implemented with dual-use semiconductor devices may also provide data storage functionality, which may enable large solar power arrays to also function as data storage centers or cloud-linked data storage.

The following discussion describes an operating environment, techniques that may be employed in the operating environment, and a system in which components of the operating environment can be embodied. In the context of the present disclosure, reference is made to the operating environment by way of example only.

Operating Environment

FIG. 1 illustrates an example operating environment 100 having a solar power and data storage array 102 (array 102) that is implemented in accordance with one or more aspects. Although illustrated as an array, the solar power and data storage array 102 may be implemented as any suitable configuration of one or more dual-use semiconductor devices 104 to provide power generation and data storage. For example, one or more of the dual-use semiconductor devices 104 may be implemented as a solar cell, a solar panel, a roofing tile, a vehicle body panel or window, road surfacing tile, flexible solar mat, foldable solar sheet, buoyant solar sheet, or the like to provide power generation and data storage. Alternatively or additionally, the array may be implemented as a part of or in association with any suitable device, such as a smart-phone, netbook, tablet computer, smart-grid device, home solar system, access point, network-attached storage, smart appliance, set-top box, server, automotive computing system, or any other suitable type of device.

In this example, the array 102 includes the dual-use semiconductor devices 104, a configuration controller 106, and configuration circuitry 108 that may be implemented as a part of or in association with the dual-use semiconductor devices 104. Generally, the configuration controller 106 may be implemented to manage or control the configuration circuitry 108 associated with the dual-use semiconductor devices 104 to configure the devices for respective solar power generation or data storage functionalities. In some cases, the configuration controller 106 is maintained on a hardware-based memory (not shown) of the array 102 as processor-executable instructions that are executed by a hardware-based processor to implement the configuration controller 106 and perform various operations associated with the controller.

As shown in FIG. 1, the array 102 also includes a power interface 110 and a data storage interface 112. The power interface 110 may couple or connect the array 102 to any suitable power conditioning or power storage entity, such as a smart-grid appliance 114 in the present example. The smart-grid appliance 114 may condition and/or store electrical power generated by the array 102 for use by a home, local power distribution network, electrical grid, or the like. The data storage interface 112 may be implemented as any suitable type of data or network interface, such as a wired or wireless network interface. In this example, the data storage interface 112 is coupled to the Internet 116, through which other networks or data storage systems may be accessed. Alternatively or additionally, remote devices (not shown) may also access (e.g., read or write) information or data stored by the array 102 via the Internet 116, a local network, direct connection, or the like.

Figure 2:
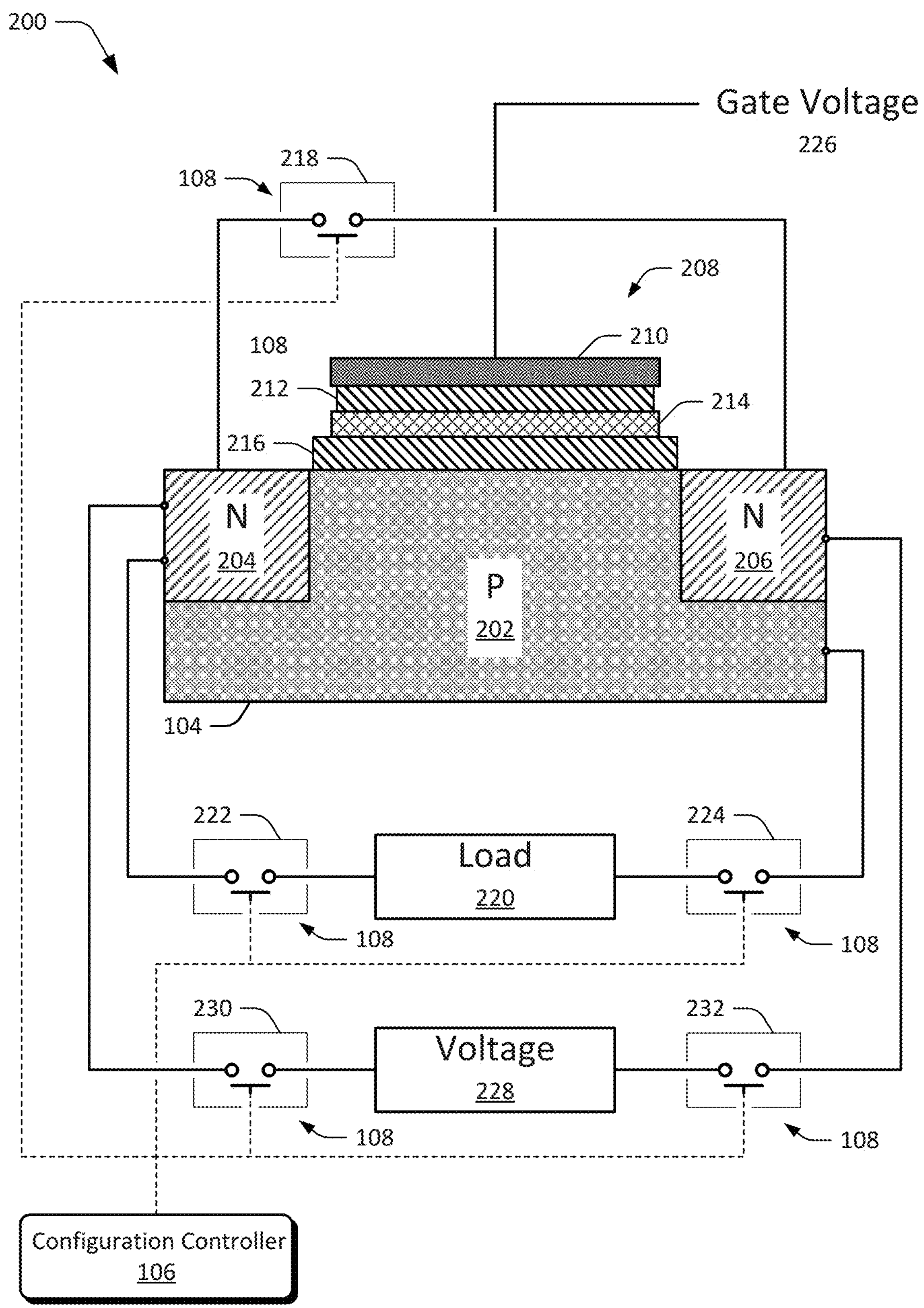
FIG. 2 illustrates an example configuration of a dual-use semiconductor device for solar power and data storage in accordance with one or more aspects.

FIG. 2 illustrates an example configuration 200 of a dual-use semiconductor device 104 for solar power and data storage in accordance with one or more aspects. In this example, the dual-use semiconductor device 104 is shown as an n-channel device having a p-type well (e.g., substrate or body) with two n-type regions (or wells) that form a source and drain of the device, respectively. Generally, any aspects described herein may be implemented with a dual-use semiconductor device 104 having a first region (e.g., n-type region 204) and a second type region (n-type region 206) having a same type of doping and a well (e.g., p-type well 202) having a different type of doping. As such, that any device described herein may be implemented with alternate modes, topologies, polarities, or the like. For example, a dual-use semiconductor device 104 may also be implemented as a p-channel device with corresponding n-type well and terminals (e.g., data access terminals or source and drain) formed with p-type regions.

In this example, the dual-use semiconductor device 104 includes a p-type well 202, a first n-type region 204 (e.g., a source), and a second n-type region 206 (e.g., a drain). The dual-use semiconductor device 104 also includes a floating-gate structure 208 disposed over the p-type well or body of the dual-use semiconductor device. In some cases, the floating-gate structure 208 includes a control gate 210, a first layer of insulative material 212, a floating-gate 214, and a second layer of insulative material 216. Note, that all elements of FIG. 2 may not be shown at respective scale, such that the floating-gate structure 208 may be disposed over some portion of the p-type well 202 without being proximate to either or both of n-type regions 204 and 206. In other words, the floating-gate structure 208 may be shown enlarged to illustrate detail, though be implemented smaller relative to other geometries of the dual-use transistor device 104, such as an exposed PN junction of the p-type well and n-type regions. Alternatively or additionally, the dual-use semiconductor device 104 may be formed with any suitable type of semiconductor materials, such as silicon or Gallium arsenide (GaAs).

In various aspects, the two n-type regions or n-type wells of the dual-use semiconductor device 104 are connectable (or couplable), such that the two n-type regions may be electrically connected or shorted together. In this example, the dual-use semiconductor device 104 includes or is associated with configuration circuitry 108 implemented as a switch device 218 (or switch element). The switch device may be implemented as any suitable type of device, which is a field-effect transistor on a same or different substrate as the body of the dual-use semiconductor device 104. As shown in FIG. 2, the configuration controller 106 of the dual-use semiconductor device 104 may control or actuate the switch device 218 to connect or disconnect the n-type region 204 and the n-type region 206. Generally, the dual-use semiconductor device 104 is configurable as a photo-voltaic cell, photo diode, or PN junction when the switch device is 218 coupled between the first n-type region 204 and the second n-type region 206 connects the first n-type region to the second n-type region. In some cases, the PN junction formed between the p-type well 202 and the n-type junctions 204 and 206 is at least partially optically exposed to enable the reception of light by the dual-use semiconductor device 104 for power generation. Alternatively or additionally, the dual-use semiconductor device is configurable as a memory cell when the switch device 218 coupled between the first n-type region 204 and the second n-type region 206 is open and the first n-type region is not connected to the second n-type region.

When configured as a photo diode or solar cell, the dual-use semiconductor device 104 may be connected to a load 220 by configuration circuitry 108 that includes a switch device 222 and/or a switch device 224. In some cases, the dual-use semiconductor device 104 includes a first contact (e.g., front, back, or power contact) on the p-type well and a second contact (e.g., back, front, or power) on one of the first n-type region or the second n-type region. In such cases, a switch device may be coupled between a power output node (e.g., load terminal) of the dual-use semiconductor device and at least one of the first contact or the second contact. As shown in FIG. 2, the configuration controller 106 may control or actuate (e.g., close or open) either or both of the switch devices 222 or 224 to connect or disconnect the load 220 from the dual-use semiconductor device 104.

In some aspects, the dual-use semiconductor device 104 is configured as a memory cell or memory transistor when the first n-type region 204 is not coupled or not connected to the second n-type region 206. In some cases, the disconnected regions provide respective data storage access terminals for the dual-use semiconductor device 104 when configured as a memory cell. Access to the dual-use semiconductor device 104 for data storage may include application of a gate voltage 226 to the gate 210 of the floating-gate structure 208. For example, a memory interface or memory controller associated with the dual-use semiconductor device 104 may write data to or read data from the dual-use semiconductor device 104 as a flash memory cell via the gate 210 (e.g., control gate).

To enable memory access of the dual-use semiconductor device 104 as a memory cell, a voltage 228 may be applied across the first n-type region and second n-type region by switch device 230 and/or switch device 232. In some aspects, the switch device 230 may ground the first n-type region 204 and the switch device 232 may apply a voltage (e.g., bit line voltage) to the second n-type region 206 to enable data access of the dual-use semiconductor device 104. These are but a few examples of how a dual-use semiconductor device 104 may be implemented or used, others of which are described throughout this disclosure.

Figure 3:
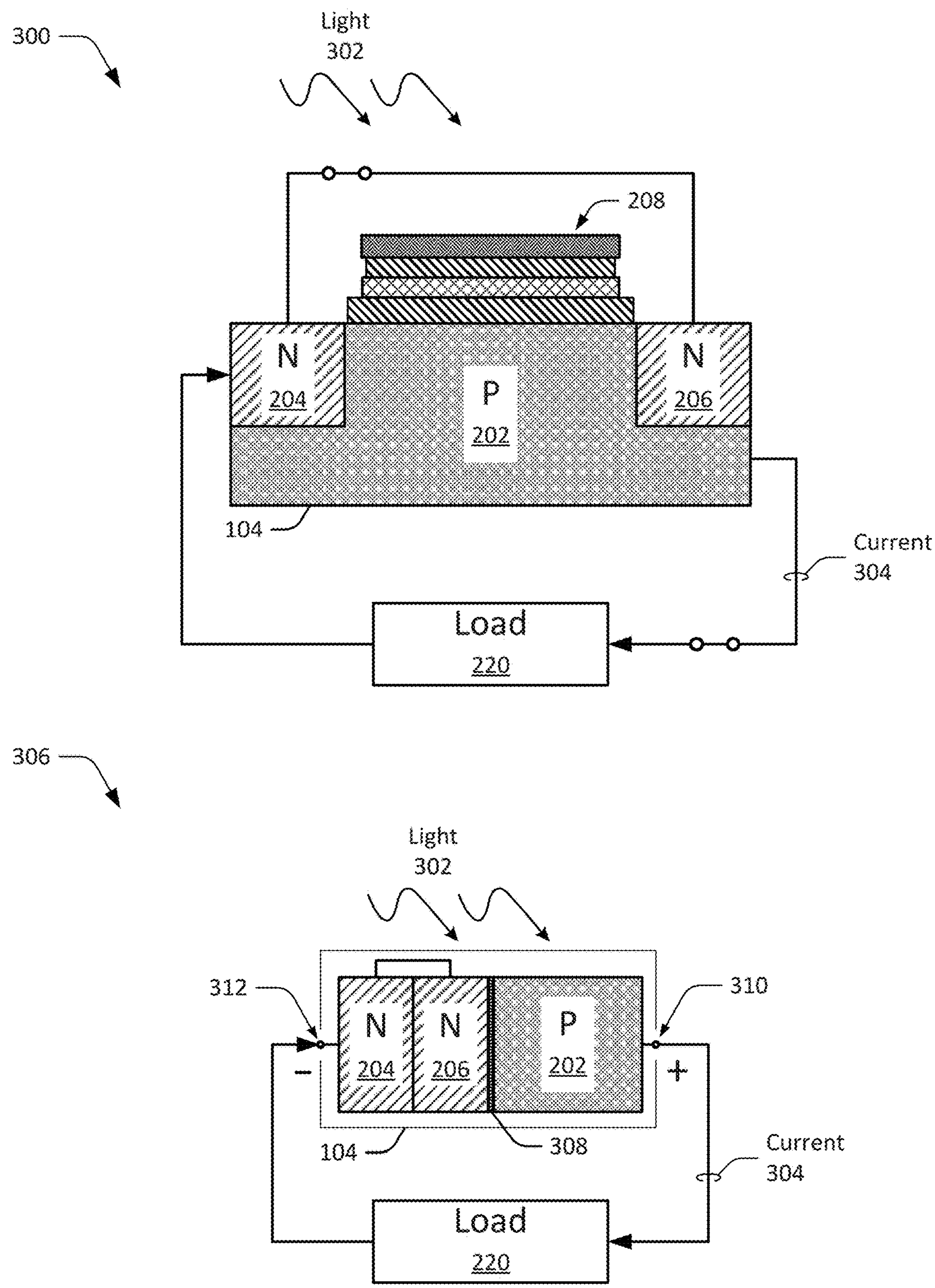
FIG. 3 illustrates an example of a dual-use semiconductor device that is configured to provide solar power functionality.

FIG. 3 illustrates at 300 an example of a dual-use semiconductor device that is configured to provide solar power functionality in accordance with various aspects. In some aspects, two regions having a same type of doping, such as the two n-type regions 204 and 206 of the dual-use semiconductor device 104, are shorted to create or implement a PN photo diode. When configured for power generation, a PN junction formed between the p-type well and n-type regions receive light 302 via an optically exposed area or a light sensitive interface of the dual-use semiconductor device 104. In response to the light 302, the dual-use semiconductor device 104 generates electrical current 304, which is provided to the load 220. Note, any charge or data stored in the floating-gate structure 208 is not affected by the electrical current generated by the dual-use semiconductor device 104 when operating as a power generating cell or device. Alternatively or additionally, the dual-use semiconductor device 104 may remain or continue to act as a solar cell until a request for memory access is received for read or write operations.

As another example, consider an alternate depiction 306 in which the dual-use semiconductor device 104 is shown in photo diode configuration. A PN junction of the dual-use semiconductor device 104 is formed by the n-type regions 204 and 206 that form a combined n-type region with a depletion zone 308 between the p-type well (or region) 202. This configuration may be similar to that of a solar cell or photo diode, such that electrical current 304 is generated in response to photons of incident light 302 that interact with the PN junction of the dual-use semiconductor device 104. Alternatively or additionally, the dual-use semiconductor device 104 may include dedicated power contacts 310 and 312 by which electrical current is provided to the load 220 or to one or more other dual-use semiconductor devices 104 that are coupled in series (e.g., via respective power contacts or interconnects) with the dual-use semiconductor device 104.

Figure 4:
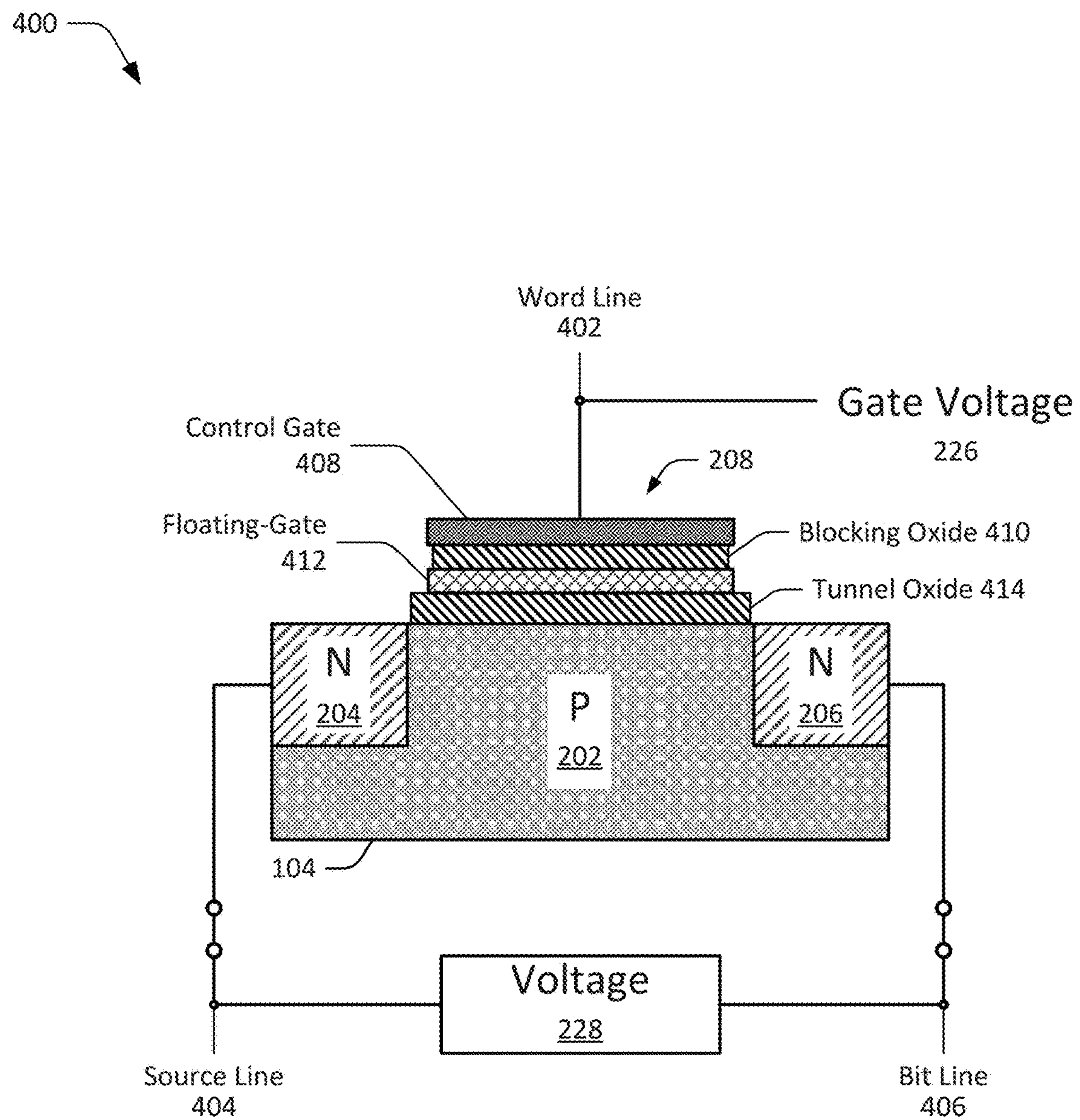
FIG. 4 illustrates an example of a dual-use semiconductor device that is configured to provide data storage functionality.

FIG. 4 illustrates at 400 an example of a dual-use semiconductor device that is configured to provide data storage functionality. This may be referred to as "memory cell mode" in which the dual-use semiconductor device 104 is configured as a floating-gate transistor or flash memory cell. When the dual-use semiconductor device 104 is configured as a memory cell, the dual-use semiconductor device 104 may not generate power because the n-type regions 204 and 206 are not connected (e.g., switch device 218 is open). In some aspects, the dual-use semiconductor device 104 is implemented as a NAND flash cell or a NOR flash cell for storing a data or bit value with the floating-gate structure 208.

In this example, the dual-use semiconductor device 104 is shown with memory access terminals for a word line 402 (e.g., gate terminal or control gate), source line 404 (e.g., source terminal), and bit line 406 (e.g., drain terminal). When configured as a memory cell, the voltage 228 may be applied across or to the source line 404 and bit line 406 to enable read or write operations via the word line 402 or control gate 408 of the floating-gate structure 208. In other words, a source-drain voltage is applied across the n-type regions and a gate voltage controls the flash read and write operations. Alternatively or additionally, data stored to the dual-use semiconductor device 104 may be erased by applying sufficient voltage of reverse polarity across the source line 404 and bit line 406, such as through a block erase operation applied to an array of dual-use semiconductor devices 104 in memory cell mode. Here, the floating-gate structure 208 may also be implemented with a layer of blocking oxide 410 (e.g., insulative layer), a floating-gate 412, and a layer of tunnel oxide 414 (e.g., insulative layer) that permits electron migration for data storage operations.

Generally, with respect to data storage, a charge of the floating-gate 412 of the floating-gate structure 208 affects a threshold of the dual-use semiconductor device (e.g., configured as a floating-gate transistor). Thus, an amount of current that flows through the dual-use semiconductor device in response to a read voltage applied to the control gate 408 indicates a value of a bit or multiple bits stored by the dual-use semiconductor device. In other words, a negative charge of electrons on the floating gate 412 may prevent the control gate 408 of the structure from activating the dual-use semiconductor device 104 when the read voltage is applied and no current flows between through the dual-use semiconductor device (e.g., logic 0).

Alternatively or additionally, when a negative charge is not present on the floating gate 412 (e.g., absence of electrons), the control gate 408 is able to activate the dual-use semiconductor device when the read voltage is applied and current flows between through the dual-use semiconductor device (e.g., logic 1). As such, a value of a bit or multiple bits stored by the dual-use semiconductor device may be read by selectively applying a read voltage to the control gate 408 of the floating-gate structure 208 and measuring an amount of current that is able to flow through or between the regions having the same type of doping. In some aspects, the dual-use semiconductor device is configured as a single-level cell (SLC) memory device and the amount of current flow responsive to application of the read voltage indicates one binary bit value stored by the dual-use semiconductor device. Alternatively, the dual-use semiconductor device may be implemented as a multiple-level cell (MLC) memory device and the amount of current flow responsive to application of the read voltage indicates multiple bit values stored by the dual-use semiconductor device.

In some aspects, writing a bit value or multiple bit values (e.g., MLC) to the dual-use semiconductor device includes applying a first voltage to a data storage access terminal (e.g. drain) provided via one of the regions to enable current to flow through the substrate between the decoupled regions. A second voltage may then be applied to the control gate of the floating-gate structure to cause the current to flow in the substrate between the decoupled regions effective to charge the floating-gate with electrons injected from the current and through the tunnel oxide layer 414 into the floating-gate 412. This charge may correspond to the one bit value or multiple bit values written to the dual-use semiconductor, such as by affecting the threshold voltage of the dual-use semiconductor device during read operations.

A bit value may be read from the dual-use semiconductor device by applying a voltage to a data storage access terminal (e.g., source) provided via one of the decoupled regions to enable current to flow in the substrate between the decoupled regions. A read voltage or reference voltage is then applied to the control gate of the floating-gate structure to attempt to cause current to flow in the substrate between the decoupled regions. An amount of the current that flows between the decoupled regions is measured, and based on the amount of current, the value of the bit stored by the dual-use semiconductor device can be determined (e.g., no current=0, any current flow=1).

Alternatively or additionally, data stored to the dual-use semiconductor may also be erased. For example, a negative voltage can be applied to the control gate of the floating-gate structure, which has a charge of electrons that corresponds to the data stored by the dual-use semiconductor. A positive voltage is then applied to one of the data storage access terminals (e.g., source) to discharge the floating-gate by causing the electrons to tunnel from the floating-gate (away from the negative potential at the control gate) and through the second layer of insulative material to the substrate or the data storage access terminal.

Techniques of Dual-Use Semiconductor Devices

The following discussion describes techniques of dual-use semiconductor devices for solar power and data storage. These techniques may be implemented using or embodying any of the entities described herein, such as those described with reference to FIGS. 1-4 or FIG. 8. These techniques include methods illustrated in FIGS. 5, 6, and 7, each of which is shown as a set of operations performed by one or more entities. These methods are not necessarily limited to the orders of operations shown. Rather, any of the operations may be repeated, skipped, substituted, or re-ordered to implement various aspects described herein. Further, these methods may be used in conjunction with one another, in whole or in part, whether performed by the same entity, separate entities, or any combination thereof. In portions of the following discussion, reference will be made to the operating environment 100 of FIG. 1 and entities of FIG. 2, FIG. 3, and/or FIG. 4 by way of example. Such reference is not to be taken as limiting described aspects to the operating environment 100, entities, or configurations, but rather as illustrative of one of a variety of examples. Alternatively or additionally, operations of the methods may also be implemented by or with entities described with reference to a system of FIG. 8.

Figure 5:
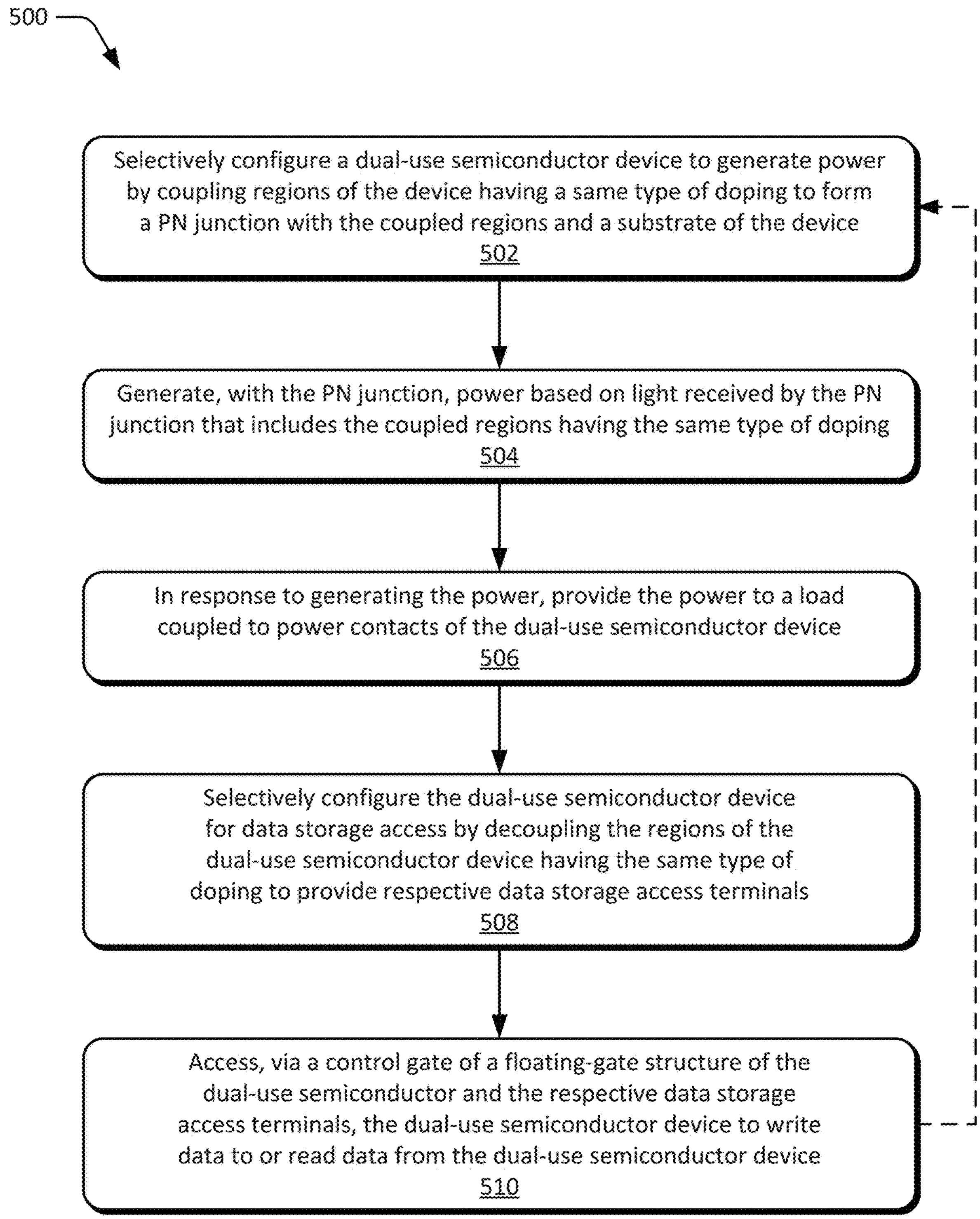
FIG. 5 depicts an example method for selectively configuring a dual-use semiconductor device for solar power or data storage functionalities.

FIG. 5 depicts an example method 500 for configuring a dual-use semiconductor device for solar power or data storage functionalities. In various aspects, the method 500 is implemented with the dual-use semiconductor devices 104 and/or by the configuration controller 106 as described throughout the disclosure.

At 502, a dual-use semiconductor device is selectively configured to generate power by coupling regions of the device having a same type of doping to form a PN junction with the coupled regions and a substrate of the device. The PN junction may generate or provide power in response to light received through an exposed PN junction. In some cases, two n-type regions or wells of the dual-use semiconductor device are shorted to form the PN junction or photo diode.

At 504, power is generated, with the PN junction, based on light received by the PN junction that includes the coupled regions having the same type of doping. For example, the dual-use semiconductor device may function as a solar cell or photo diode when the two regions having the same type of doping are connected or coupled.

At 506, in response to generating the power, the dual-use semiconductor device provides the power to a load coupled to contacts of the dual-use semiconductor device. The load may be coupled to the dual-use semiconductor device by one or more switch devices controlled by a configuration controller associated with the dual-use semiconductor device.

At 508, the dual-use semiconductor device is selectively configured for data storage access by decoupling the regions of the dual-use semiconductor device having the same type of doping to provide respective data storage access terminals. The respective data storage access terminals may include drain and source terminals when the dual-use semiconductor device is configured as a floating-gate transistor for data storage. In some cases, two n-type regions or wells of the dual-use semiconductor device are disconnected or decoupled to change the dual-use semiconductor device from a photo diode configuration to a memory cell mode configuration. By so doing, access to a floating-gate structure of the dual-use semiconductor device may be enabled for data read or write operations.

At 510, the dual-use semiconductor device is accessed via a control gate of a floating-gate structure of the dual-use semiconductor and the respective data storage access terminals to write data to or read data from the dual-use semiconductor device. In some cases, a read voltage is applied to the control gate and current flowing between the data storage access terminals is measured to determine a value of at least one bit value stored by the dual-use semiconductor device.

In other cases, a programming voltage may be applied to the control gate to draw electrons into a floating gate of the floating-gate structure to write a bit value to the dual-use semiconductor device. Alternatively or additionally, a source-drain voltage may be applied across the two regions of the dual-use semiconductor device to enable data access via the gate contact, similar to a flash memory access operation. From operation 508, the method 500 may return to operation 502 to reconfigure the dual-use semiconductor device for power generation operations.

Figure 6:
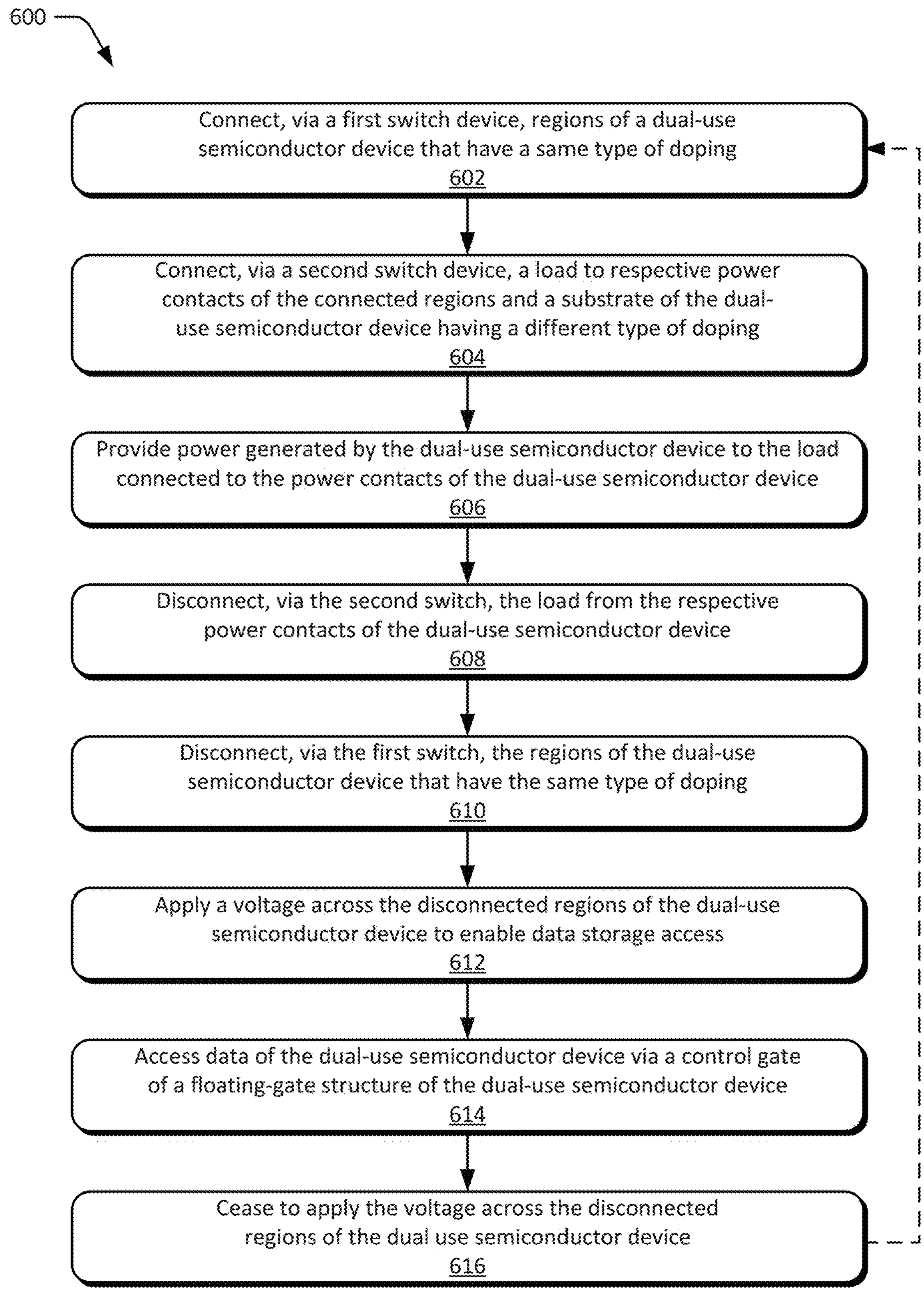
FIG. 6 depicts an example method for generating power or storing data with a dual-use semiconductor device in accordance with one or more aspects.

FIG. 6 depicts an example method 600 for generating power or storing data with a dual-use semiconductor device. In various aspects, the method 600 is implemented with the dual-use semiconductor devices 104 and/or by the configuration controller 106 as described throughout the disclosure.

At 602, regions of a dual-use semiconductor device that have a same type of doping are coupled or connected via a switch device. In some cases, two n-type regions of the dual-use semiconductor device are shorted or electrically connected to implement a photo-reactive PN junction or solar cell with the dual-use semiconductor device. Alternatively or additionally, a switch device, such as another field-effect transistor (FET) is used to connect two n-type regions or two p-type regions of a dual-use semiconductor device.

At 604, a load is connected, via a second switch, to respective power contacts of the connected regions and a substrate of the dual-use semiconductor device having a different type of doping. In some cases, the load is connected or coupled to respective contacts of the connected n-type regions and a p-type well of the dual-use semiconductor device. The load may be coupled to contacts of the PN junction formed by connecting the two n-type regions of the dual-use semiconductor device. In some cases, one or more switch devices are activated to couple the load to the dual-use semiconductor device or to couple the dual-use semiconductor device to other dual-use semiconductor devices. In the latter case, a load may be connected to or across multiple dual-use semiconductor devices.

At 606, power generated by the dual-use semiconductor device is provided to the load connected to the power contacts of the dual-use semiconductor device. Any suitable number of the dual-use semiconductor devices may be connected in series to provide power at an intended voltage level for the load. Alternatively or additionally, power conditioning circuitry may be coupled between the dual-use semiconductor devices and the load to buck or boost the power generated by the dual-use semiconductor devices to a desired voltage level.

At 608, the load is disconnected, via the second switch, from the respective power contacts of the dual-use semiconductor device. In some cases, the second switch is opened to disconnect the load in response to the dual-use semiconductor device being selectively configured from a photo diode to a memory cell.

At 610, the regions of the dual-use semiconductor device that have the same type of doping are disconnected via the first switch. In some cases, the first switch is opened by a configuration controller to disconnect the regions having the same type of doping. For example, the n-type regions of the dual-use semiconductor device may be disconnected by opening a switch device coupled between the n-type regions of the dual-use semiconductor device. Disconnecting the n-type regions of the dual-use semiconductor device may be effective to configure the dual-use semiconductor device from a photo diode mode to a memory cell mode, which enables read and write operations to a floating-gate structure of the dual-use semiconductor device.

At 612, a voltage is applied across the disconnected regions of the dual-use semiconductor device to enable data storage access. In some cases, a voltage is applied across the unconnected n-type regions of the dual-use semiconductor device to enable current flow or electron tunneling. This may include grounding one of the n-type regions, directly or through another dual-use semiconductor device, and applying a voltage to the other n-type region of the dual-use semiconductor device. In some cases, a memory interface or memory controller associated with the dual-use semiconductor device applies the voltage using a bit line coupled to one of the n-type regions or drain terminal of the device.

At 614, data of the dual-use semiconductor device is accessed via a control gate of a floating-gate structure of the dual-use semiconductor device. The data may also be accessed using a data access terminal of the dual-use semiconductor device provided via one of the disconnected regions (e.g., source or drain). Generally, by applying a voltage to the gate, a memory controller may read data from or write data to the dual-use semiconductor device. In other words, the dual-use semiconductor device may be accessed in ways similar to a flash memory cell, to determine a value stored by a charge of the floating-gate structure or to write a value to the floating-gate structure by storing an appropriate level of charge to the floating-gate of the dual-use semiconductor device.

At 616, application of the voltage across the disconnected regions of the dual-use semiconductor device is ceased. In some cases, the application of the voltage across the n-type regions of the dual-use semiconductor device is ceased. The application of the voltage may cease after a bit value is stored to or read from the floating-gate structure of the dual-use semiconductor device. From operation 614, the method 600 may proceed or return to operation 602 to implement operations to reconfigure the dual-use semiconductor device for power generation.

Figure 7:
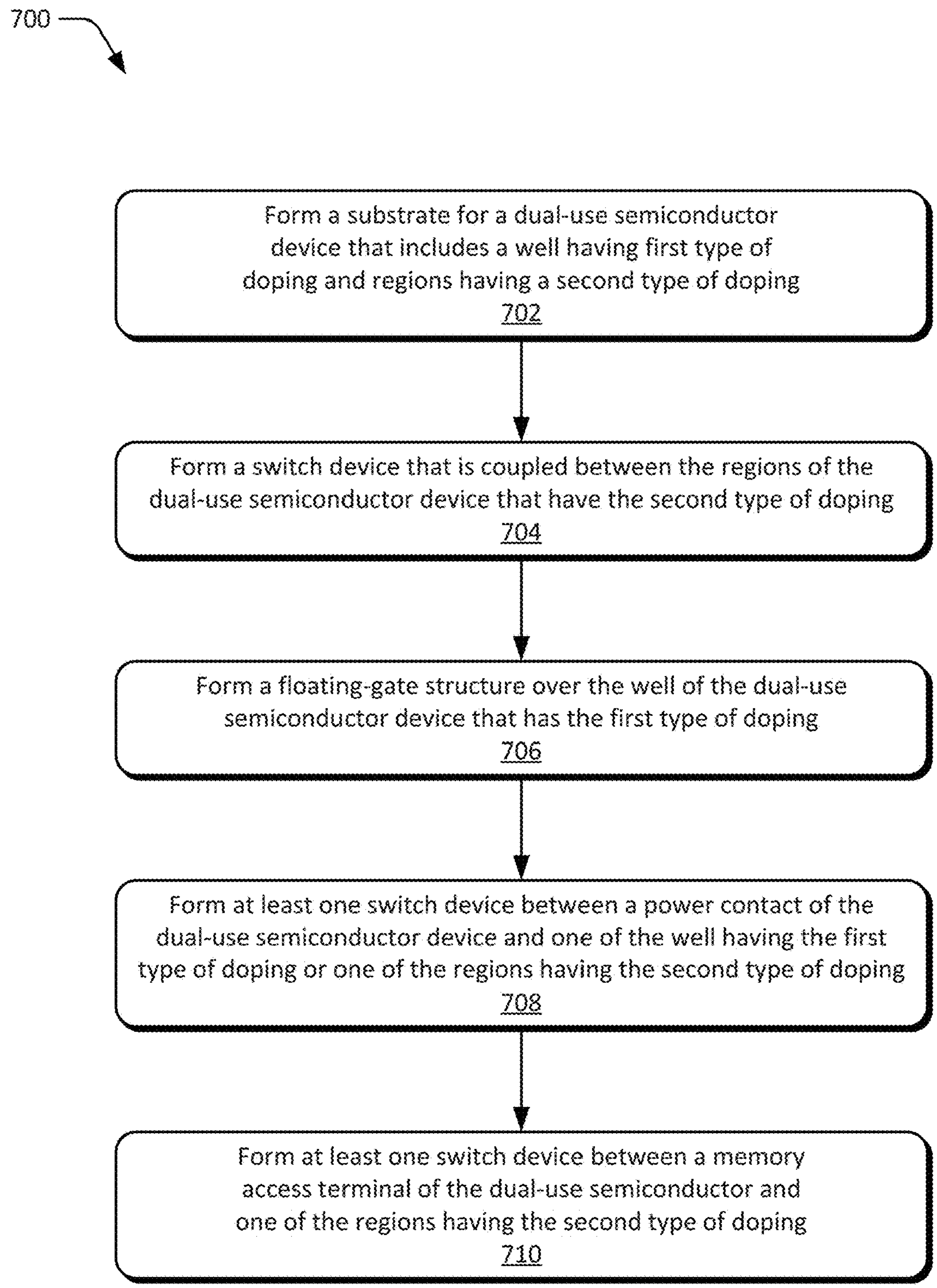
FIG. 7 depicts an example method for forming a dual-use semiconductor device for solar power and data storage.

FIG. 7 depicts an example method 700 for forming a dual-use semiconductor device for solar power and data storage. In various aspects, the method 700 may be implemented to fabricate or form dual-use semiconductor substrates or devices for implementing dual-use circuitry. Alternatively or additionally, the operations described with reference to method 700 or other methods may be implemented through one or more semiconductor fabrication processes, such as photolithography, masking, etching, chemical vapor deposition, and/or chemical mechanical planarization.

At 702, a substrate for a dual-use semiconductor device is formed that includes a well having first type of doping and regions having a second type of doping. In some cases, a substrate is formed that includes a p-type well and n-type regions. The dual-use semiconductor device may be formed to enable reception of light through at least a portion of the p-type well and/or n-type regions to enable configuration of the dual-use semiconductor device as a photo diode.

At 704, a switch device is formed between and couples the regions of the dual-use semiconductor device that have the second type of doping. For example, a switch device may be formed between the n-type regions of the dual-use semiconductor device. Alternatively or additionally, respective terminals of the n-type regions may be formed or exposed to enable shorting or connection of the n-type regions. By so doing, the dual-use semiconductor device may be configurable as a photo diode or solar cell.

At 706, a floating-gate structure is formed over the well of the dual-use semiconductor device that has the first type of doping. In some cases, a floating-gate structure is formed over the p-type well of the dual-use semiconductor device. The floating-gate structure may include a first layer of insulative material, a floating-gate formed between the first layer of insulative material and a second layer of insulative material, and a control gate formed above the second layer of insulative material. The floating-gate structure may be sized or positioned to minimize occlusion of light incident on a surface of the dual-use semiconductor device. Alternatively or additionally, one or more peninsulas of the n-type regions may be formed to support operation of the floating-gate structure when the floating-gate structure is not positioned between or proximate both of the n-type regions.

At 708, at least one switch device is formed between a power contact of the dual-use semiconductor device and one of the well having the first type of doping or one of the regions having the second type of doping. For example, a switch device may be formed between a power contact of the dual-use semiconductor device and one of the p-type well or one of the n-type regions. Alternatively, the power contact of the dual-use semiconductor device may be formed and exposed to enable external coupling of a load or another dual-use semiconductor device. The switch device may enable coupling of at least one terminal of the PN junction of the dual-use semiconductor device to the load, to enable an application of power generated by the dual-use semiconductor device to the load.

At 710, at least one switch device is formed between a memory access terminal of the dual-use semiconductor and one of the regions having the second type of doping. In some cases, a switch device is formed between a memory access terminal (e.g., source or drain) of the dual-use semiconductor device and one of the n-type regions. When configured as a floating-gate transistor, the at least one switch device may couple a memory interface to a control gate, source, or drain of the dual-use semiconductor device. By so doing, the at least one switch device may enable access to the dual-use semiconductor device via a corresponding source line, bit line, and/or word line for data storage operations.

System for Solar Power and Data Storage

Figure 8:
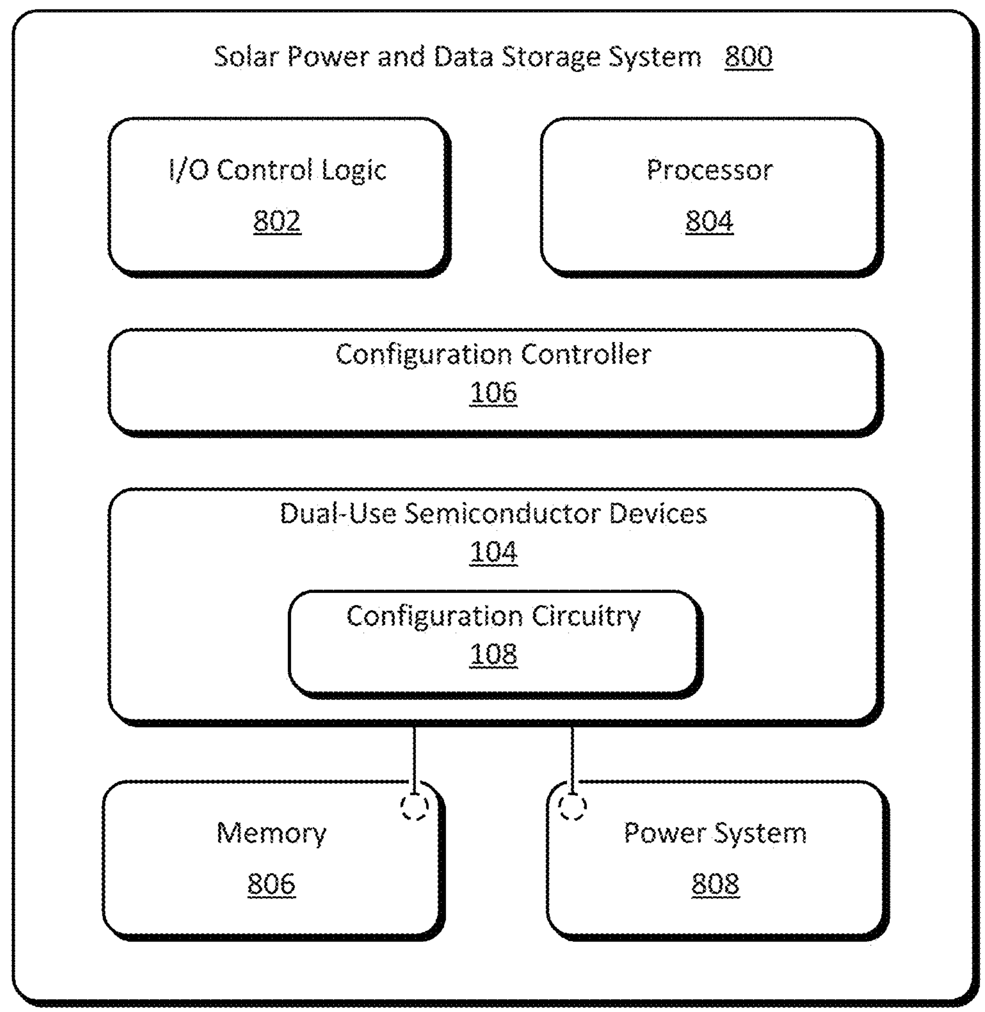
FIG. 8 illustrates an example solar power and data storage system in which aspects of the dual-use semiconductor devices can be implemented.

FIG. 8 illustrates an exemplary configuration of a solar power and data storage system 800 (system 800) in which aspects of the dual-use semiconductor devices are implemented. The system 800 may be configured for or implemented in association with any suitable device, such as a smart-phone, netbook, tablet computer, access point, network-attached storage, smart appliance, set-top box, server, automotive computing system, or any other suitable type of device (e.g., others described herein). Although described with reference to a system, the entities of FIG. 8 may also be implemented as other types of integrated circuits or systems, such as an a system-on-chip (SoC), application-specific integrated-circuit (ASIC), application-specific standard product (ASSP), digital signal processor (DSP), multi-chip module (MCM), programmable SoC (PSoC), system-in-package (SiP), or field-programmable gate array (FPGA).

The system 800 may be integrated with electronic circuitry, a microprocessor, memory, input-output (I/O) control logic, communication interfaces, firmware, and/or software useful to provide the functionalities of a memory device or solar power device. The system may also include an integrated data bus, interconnect fabric (not shown), or power rails that couple the various components of the system for data communication or power transmission between the components. The integrated data bus, interconnect fabric, power rails, or other components of the system 800 may be exposed or accessed through an external port, power interface, and/or data interface.

In this example, the system 800 includes various components such as input-output (I/O) control logic 802 and a processor 804, such as a microprocessor, processor core, application processor, DSP, or the like. The system 800 also includes memory 806 and a power system 808 to provide power management functionality for the system. In some cases, the power system 808 includes or is coupled to power storage elements or power transmission elements to store or transmit power generated by the system 800. The memory 806 may include any type and/or combination of RAM, SRAM, DRAM, non-volatile memory, ROM, one-time programmable (OTP) memory, Flash memory, and/or other suitable electronic data storage. In the context of this disclosure, the memory 806 stores data, instructions, or other information via non-transitory signals, and does not include carrier waves or transitory signals.

The system 800 may also include firmware, applications, programs, software, and/or an operating system, which may be embodied as processor-executable instructions maintained on the memory 806 or another memory of the system 800 for execution by the processor 804 to implement functionalities of the system 800. In this example, the system 800 includes a configuration controller 106 that may be implemented to configure dual-use semiconductor devices 104 of the system 800 for solar power generation or data storage. Similar to firmware, the configuration controller 106 may be embodied as processor-executable on the memory 806 or a hardware-based memory device of the system 800 and implemented in response to execution by the processor 804. The system 800 may also include other communication interfaces, such as a transceiver interface for controlling or communicating with components of a local on-chip (not shown) or off-chip communication transceiver. The transceiver interface may also implement a signal interface to communicate radio frequency (RF), intermediate frequency (IF), or baseband frequency signals off-chip to facilitate wired or wireless communication through transceivers, physical layer transceivers (PHYs), or media access controllers (MACs) coupled to the system 800.

The memory 806 and power system 808 components of the system 800 are implemented with dual-use semiconductor devices 104, which include configuration circuitry 108. In some aspects, the configuration controller 106 of the system 800 is implemented to configure the dual-use semiconductor devices 104 via the configuration circuitry 108 for solar power generation or for data storage. The dual-use semiconductor devices 104 and configuration circuitry 108 of the system 800 may be embodied as described with reference to various aspects presented herein. Examples of these components and/or entities, or corresponding functionality, are described with reference to the respective components or entities of the environment 100 of FIG. 1 or respective configurations illustrated in FIG. 2, FIG. 3, and/or FIG. 4.

The dual-use semiconductor devices 104, configuration controller 106, and configuration circuitry 108 may be implemented independently or in combination with any suitable component or circuitry to implement aspects described herein. For example, dual-use semiconductor devices 104 may be implemented as or part of an analog circuit, a mixed-signal circuit, a solar cell, a photo diode, a light-emitting diode, a memory cell, a current mirror, an amplifier, a filter, an analog-to-digital converter, or a digital-to-analog converter of the system 800.

Although the subject matter has been described in language specific to structural features and/or methodological operations, it is to be understood that the subject matter defined in the appended claims is not necessarily limited to the specific examples, features, or operations described herein, including orders in which they are performed.

What is claimed is:

1. A method comprising:

selectively configuring a dual-use semiconductor device to generate power by coupling, via a first switch device of the dual-use semiconductor device, a first region and a second region of the dual-use semiconductor device having a same type of doping to form a PN junction that includes the first and second regions having the same type of doping and a substrate of the dual-use semiconductor device having a different type of doping;

coupling, via a second switch device of the dual-use semiconductor device, a first contact on a well or a second contact on one of the first region or the second region of the PN junction to one of two power contacts of the dual-use semiconductor device;

generating, with the PN junction, power based on light received by the PN junction that includes the first and second regions having the same type of doping and a substrate having the different type of doping;

in response to generating the power, providing the power to a load coupled to the two power contacts of the dual-use semiconductor device;

selectively configuring the dual-use semiconductor device for data storage access by decoupling, via the first switch device, the first and second regions of the dual-use semiconductor device having the same type of doping to provide respective data storage access terminals via the decoupled first and second regions having the same type of doping;

decoupling, via the second switch device of the dual-use semiconductor device, the first contact on the well or the second contact on one of the first region or the second region from the one of the two power contacts of the dual-use semiconductor device; and accessing, via a control gate of a floating-gate structure of the dual-use semiconductor device and at least one of the respective data storage access terminals, the dual-use semiconductor device to write data to or read data from the dual-use semiconductor device, the floating-gate structure formed on the substrate of the dual-use semiconductor device and having a floating-gate isolated from the control gate of the floating-gate structure by a first layer of insulative material and isolated from the substrate by a second layer of insulative material.

2. The method as recited in claim 1, wherein:

selectively configuring the dual-use semiconductor device to generate power by coupling the first and second regions of the dual-use semiconductor device having the same type of doping configures the dual-use semiconductor device as a photovoltaic cell; and selectively configuring the dual-use semiconductor device for data storage access by decoupling the first and second regions of the dual-use semiconductor device having the same type of doping configures the dual-use semiconductor device as a memory cell.

3. The method as recited in claim 1, further comprising writing at least one bit value to the dual-use semiconductor device by:

applying a first voltage to one of the data storage access terminals provided via one of the decoupled first or second regions to enable current to flow through the substrate between the decoupled first and second regions; and applying a second voltage to the control gate of the floating-gate structure to cause the current to flow in the substrate between the first and second decoupled regions effective to charge the floating-gate with electrons injected from the current and through the second layer of insulative material into the floating-gate, the charge of the floating-gate corresponding to the at least one bit value written to the dual-use semiconductor.

4. The method as recited in claim 1, further comprising reading at least one bit value stored by the dual-use semiconductor device by:

applying a first voltage to one of the data storage access terminals provided via one of the first or second decoupled regions to enable current to flow in the substrate between the first and second decoupled regions;

applying a second voltage to the control gate of the floating-gate structure to cause the current to flow in the substrate between the first and second decoupled regions;

determining an amount of the current that flows between the first and second decoupled regions; and determine, based on the amount of the current that flows between the first and second decoupled regions, the at least one bit value stored by the dual-use semiconductor device.

5. The method as recited in claim 4, wherein:

the dual-use semiconductor device is selectively configured as a single-level cell (SLC) memory device and the amount of current indicates one binary bit value stored by the dual-use semiconductor device; or dual-use semiconductor device is selectively configured as a multiple-level cell (MLC) memory device and the amount of current indicates multiple bit values stored by the dual-use semiconductor device.

6. The method as recited in claim 1, further comprising erasing data stored by the dual-use semiconductor device by:

applying a first voltage to the control gate of the floating-gate structure, the floating-gate of the floating-gate structure having a charge of electrons that corresponds to the data stored by the dual-use semiconductor; and applying a second voltage to one of the data storage access terminals provided via one of the first or second decoupled regions to discharge the floating-gate by causing the electrons to tunnel from the floating-gate and through the second layer of insulative material to the substrate or the data storage access terminal, the second voltage higher than the first voltage.

7. The method as recited in claim 1, wherein a plurality of dual-use semiconductor devices includes the dual-use semiconductor device, the plurality of dual-use semiconductors each include respective first and second regions having a same type of doping, and the method further comprises:

selectively coupling the respective regions first and second of the plurality of dual-use semiconductor devices to generate power as a solar power array formed by the plurality of dual-use semiconductor devices; or selectively decoupling the respective first and second regions of the plurality of dual-use semiconductor devices to enable data storage access to a memory array formed by the plurality of dual-use semiconductor devices.

8. The method as recited in claim 1, wherein the PN junction between the well and at least one of the first region or the second region is optically exposed to enable the PN junction to receive the light to enable the generation of the power.

9. A dual-use semiconductor device comprising:

a substrate that includes a first region and a second region having a same type doping and a well having a different type of doping;

a first contact on the well and a second contact on one of the first region or the second region;

a first switch device coupled between the first region and the second region that is configured to selectively connect the first region to the second region to generate power and disconnect the first region from the second region to enable storage of at least one bit value;

a second switch device coupled between a power output node of the dual-use semiconductor device and one of the first contact or the second contact, the second switch device configured to selectively connect the power output node to the one of the first contact or second contact to enable a load coupled to the power output node to receive the power generated by the dual-use semiconductor device; and a floating-gate structure disposed over at least a portion of the well that is configured to store a charge that corresponds to the at least one bit value, the floating-gate structure including:

a first layer of insulative material disposed over the at least a portion of the well and configured to permit tunneling electrons to enter or leave the floating-gate structure;

a floating-gate disposed over the first layer of insulative material and configured to store, while insulated from the well by the first layer of insulative material, the charge that corresponds to the at least one bit value based on the tunneling electrons that enter or leave the floating-gate structure;

a second layer of insulative material disposed over the floating-gate of the floating-gate structure; and a control gate disposed over and insulated from the floating-gate by the second layer of insulative material, the control gate configured to control the tunneling of the electrons to charge or discharge the floating-gate structure.

10. The dual-use semiconductor device as recited in claim 9, wherein a PN junction between the well and at least one of the first region or the second region is optically exposed to enable reception of light.

11. The dual-use semiconductor device as recited in claim 9, wherein a PN junction between the well and both of the first region and the second region are optically exposed to enable reception of light.

12. The dual-use semiconductor device as recited in claim 9, further comprising:

a third switch device coupled between the first region and a first voltage source, the first third switch device configured to selectively connect the first region to the first voltage source to enable erasure of the at least one bit value; or a fourth switch element coupled between the second region and a second voltage source, the fourth switch device configured to selectively connect the second region to the second voltage source to enable writing or reading of the at least one bit value.

13. The dual-use semiconductor device as recited in claim 9, further comprising:

a word line coupled to the control gate of the floating-gate structure that is configured to selectively apply voltage to the control gate to enable writing, reading, or erasure of the at least one bit value;

a source line coupled to the first region that is configured to selectively apply a second voltage to the first region to enable erasure of the at least one bit value; and a bit line coupled to the second region that is configured to selectively apply a third voltage to the second region to enable writing or reading of the at least one bit value.

14. The dual-use semiconductor device as recited in claim 9, wherein:

the same doping type of the first region and the second region is an n-type doping and the different type of doping of the well is a p-type doping; or the same doping type of the first region and the second region is a p-type doping and the different type of doping of the well is an n-type doping.

15. The dual-use semiconductor device as recited in claim 9, wherein:

the dual-use semiconductor device is selectively configurable as a photo diode when the first switch device coupled between the first region and the second region electrically connects the first region to the second region; and the dual-use semiconductor device is configurable as a memory cell when the first switch device coupled between the first region and the second region is open and the first region is disconnected from the second region.

16. A solar power and data storage system comprising:

a plurality of dual-use semiconductor devices, at least some of the dual-use semiconductor devices implemented with:

a substrate that includes a first region and a second region having a same type doping and a well having a different type of doping;

a first contact on the well and a second contact on one of the first region or the second region;

a first switch device coupled between the first region and the second region that is configured to selectively connect the first region to the second region to generate power and disconnect the first region from the second region to enable storage of at least one bit value;

a second switch device coupled between a power output node of the dual-use semiconductor device and one of the first contact or the second contact, the second switch device configured to selectively connect the power output node to the one of the first contact or second contact to enable a load coupled to the power output node to receive the power generated by the dual-use semiconductor device; and a floating-gate structure disposed over at least a portion of the well and having a floating gate configured to store a charge that corresponds to the at least one bit value while insulated from the well and a control gate of the floating-gate structure by respective layers of insulative material;

a configuration controller that is implemented to:

selectively couple the regions having the same type of doping for form, with the coupled regions and the well, a PN junction by which the dual-use semiconductor device generates the power; and selectively decouple the regions which have the same type of doping to provide respective data storage access terminals via the decoupled regions having the same type of doping to enable writing or reading of the at least one bit of data.

17. The solar power and data storage system as recited in claim 16, wherein at least some of the multiple dual-use semiconductor devices are implemented with a PN junction between the well and at least one of the first region or the second region that is optically exposed to enable reception of light.

18. The solar power and data storage system as recited in claim 16, wherein at least some of the multiple dual-use semiconductor devices are implemented with:

a word line coupled to the control gate of the floating-gate structure that is configured to selectively apply voltage to the control gate to enable writing, reading, or erasure of the at least one bit value;

a source line coupled to the first region that is configured to selectively apply a second voltage to the first region to enable erasure of the at least one bit value; and a bit line coupled to the second region that is configured to selectively apply a third voltage to the second region to enable writing or reading of the at least one bit value.

19. The solar power and data storage system as recited in claim 16, wherein at least some of the multiple dual-use semiconductor devices are selectively configurable as:

a photovoltaic cell when the first switch device coupled between the first region and the second region electrically connects the first region to the second region; and a memory cell when the first switch device coupled between the first region and the second region is open and first region is disconnected from the second region.

20. The solar power and data storage system as recited in claim 16, wherein:

at least some of the multiple dual-use semiconductor devices are selectively configurable as single-level cell (SLC) memory devices; or at least some of the multiple dual-use semiconductor devices are selectively configured as a multiple-level cell (MLC) memory devices.

* * * * *